United States Patent
De Weerdt

(10) Patent No.: US 10,345,413 B2
(45) Date of Patent: Jul. 9, 2019

(54) PROPELLER MAGNETIC RESONANCE IMAGING

(71) Applicant: KONINKLIJKE PHILIPS N.V., Eindhoven (NL)

(72) Inventor: Elwin De Weerdt, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 262 days.

(21) Appl. No.: 15/127,039

(22) PCT Filed: Mar. 20, 2015

(86) PCT No.: PCT/EP2015/055860
§ 371 (c)(1),
(2) Date: Sep. 19, 2016

(87) PCT Pub. No.: WO2015/144568
PCT Pub. Date: Oct. 1, 2015

(65) Prior Publication Data
US 2017/0115369 A1    Apr. 27, 2017

(30) Foreign Application Priority Data
Mar. 24, 2014 (EP) .................... 14161223

(51) Int. Cl.
*G01R 33/561* (2006.01)
*G01R 33/48* (2006.01)

(52) U.S. Cl.
CPC ...... *G01R 33/5611* (2013.01); *G01R 33/4818* (2013.01); *G01R 33/4824* (2013.01)

(58) Field of Classification Search
CPC ............ G01R 33/4824; G01R 33/4818; G01R 33/5611; G01R 33/56375
See application file for complete search history.

(56) References Cited

U.S. PATENT DOCUMENTS 7,102,348 B2    9/2006    Zhang et al.
7,382,127 B2    6/2008    Gaddipati et al.
(Continued)

OTHER PUBLICATIONS

Richard Winkelmann et al: "Ghost artifact removal using a parallel imaging approach", Magnetic Resonance in Medicine, vol. 54, No. 4, Jan. 1, 2005 (Jan. 1, 2005), pp. 1002-1009.*
(Continued)

*Primary Examiner* — Neel D Shah
*Assistant Examiner* — Brent J Andrews

(57) ABSTRACT

The invention provides for a magnetic resonance imaging system (100) configured for acquiring magnetic resonance data (142) from an imaging zone (108) according to a PROPELLER magnetic resonance imaging protocol. The pulse sequence is configured such that the pulse sequence data for each of the multiple blades of magnetic resonance data comprises coil specific magnetic resonance data (145, 146', 146", 146''') acquired for each of multiple antenna elements simultaneously (125, 126', 126", 126'''). The magnetic resonance imaging system is further configured to perform the following for each blade: reconstruct (214) a blade image (150, 150') from the coil specific magnetic resonance data for each antenna element according to a parallel imaging magnetic resonance imaging protocol, construct (218) a Chi map (153, 154') for the blade image using the set of coil sensitivities, the blade image, and the coil specific magnetic resonance data.

19 Claims, 15 Drawing Sheets

(56) References Cited

U.S. PATENT DOCUMENTS

| | | | |
|---|---|---|---|
| 8,073,522 B2 | 12/2011 | Stemmer | |
| 2006/0232273 A1* | 10/2006 | Takizawa | G01R 33/4824 324/309 |
| 2012/0002859 A1 | 1/2012 | Huang et al. | |
| 2012/0253175 A1* | 10/2012 | Riederer | A61B 5/055 600/411 |

OTHER PUBLICATIONS

Tzu-Chao Chuang et al: "Propeller-EPI with parallel imaging using a circularly symmetric phased-array RF coil at 3.0 T:Application to high-resolution diffusion tensor imaging",Magnetic Resonance in Medicine, vol. 56, No. 6,Jan. 1, 2006 (Jan. 1, 2006), pp. 1352-1358.

Bernstein et al "Handbook of MRI Pulse Sequences" 2004, Elsevier Academic Press p. 915-919.

TC Chuang, "Propeller EPI With Sense Parallel Imaging Using a Circularly Symmetric Phase Array RF Coil" Proc. Intl. Mag. Reson. Med., 2004, p. 535.

* cited by examiner

900

1000

1100

1200

1300

1400

PROPELLER MAGNETIC RESONANCE IMAGING

CROSS REFERENCE TO RELATED APPLICATIONS

This application is a U.S. national phase application of International Application No. PCT/EP2015/055860, filed on Mar. 20, 2015, which claims the benefit of EP Application Serial No. 14161223.4 filed on Mar. 24, 2014 and is incorporated herein by reference.

TECHNICAL FIELD

The invention relates to magnetic resonance imaging, in particular to the use of the PROPELLER magnetic resonance imaging protocol

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

During longer scan the subject can have internal or eternal motion which corrupts the data and results in images with blurs or artifacts. One way of countering this is by acquiring the magnetic resonance imaging data in groups and then correcting the magnetic resonance data to account for motion of the subject. In the periodically rotated overlapping parallel lines with enhanced reconstruction (PROPELLER) the magnetic resonance imaging data is acquired in rectlinear blocks referred to as blades. The blades are rotated with respect to each other in k-space and have an overlapping region in the center of k-space. A comparison of the overlapping region for the different blades enables compensation for motion of the subject. The PROPELLER protocol is for example reviewed on pages 915 to pages 919 of "the handbook of MRI Pulse Sequences" by Bernstein et al. published by Elsevier Academic Press, 2004.

In parallel imaging techniques multiple antenna elements are used to acquire data simultaneously. A coil sensitivity matrix or coil sensitivity maps (CSM) contains a spatial sensitivity of each of the antenna elements. The coil sensitivity maps are then used to combine the data acquired using each of the individual antenna elements into a single composite image. This greatly accelerates the acquisition of the magnetic resonance image. Magnetic resonance parallel-imaging reconstruction techniques are briefly outlined in section 13.3 of Bernstein et. al.

U.S. Pat. No. 7,102,348 B2 discloses a method of performing a PROPELLER magnetic resonance imaging protocol combined with a partial acquisition technique.

The doctoral dissertation "Improvements to highly accelerated Parallel Magnetic Resonance Imaging" by Richard Winklemann, Fakultät für Elektrotehcnik and Informationstechnik der Universitat Fridericiana Karlsruhe, 2006 discloses several methods of removing ghosting artifacts and image folding artifacts for SENSE reconstructed magnetic resonance images using a least squares (Chi squared) fit deviation.

The US-patent application US2006/0232273 concerns a PROPELLER acquisition in which under sampling in k-space is used. Aliasing images are reconstructed per blade and on the basis of the coil sensitivity distribution data, unfolded images for respective blades are formed.

SUMMARY OF THE INVENTION

The invention provides for a magnetic resonance imaging system, a method of operating the magnetic resonance imaging system, and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

Pulse sequence data as used herein encompasses data which comprises commands or which may be translated in commands which a processor may use for controlling the magnetic resonance imaging system to acquire magnetic resonance data.

A magnetic resonance imaging protocol as used herein encompasses a method or a technique for acquiring magnetic resonance data. The implementation of the magnetic resonance imaging protocol may be performed using the pulse sequence data. In other words a magnetic resonance imaging protocol may be programmed using the pulse sequence data.

A PROPELLER magnetic resonance imaging protocol as used herein encompasses a magnetic resonance imaging protocol which is also known as the periodically rotated overlapping parallel lines with enhanced reconstruction as is commonly known in the art.

In one aspect the invention provides for a magnetic resonance imaging system for acquiring magnetic resonance data from an imaging zone. The magnetic resonance imaging system comprises a radio-frequency system for acquiring the magnetic resonance data. The radio-frequency system comprises a magnetic resonance antenna with multiple antenna elements. The radio-frequency system may also contain such things as a transmitter or receiver for transmitting or receiving radio-frequency signals using the multiple antenna elements. The multiple antenna elements may have the amplitude and/or phase of radio-frequency power delivered to them. The magnetic resonance imaging system further comprises a processor for controlling the magnetic resonance imaging system.

A processor as used herein is also understood to encompass one or more processors. In the case of one or more processors the processor may for instance be distributed with the multiple or more than one processor being part of one or more computer or control systems. The magnetic resonance imaging system further comprises a memory containing pulse sequence data, a set of coil sensitivities for the multiple antenna elements, and machine-executable instructions. A coil sensitivity as used herein encompasses the spatial dependence of the B1 field of a receive coil. The set of coil sensitivities refers to the coil sensitivity for each of the multiple antenna elements. The term coil sensitivity or sensitivities as used herein is intended to be interpreted as is commonly known in the art for various parallel-imaging techniques. The pulse sequence data is configured to cause the processor to acquire the magnetic resonance data as multiple blades of magnetic resonance data according to a PROPELLER magnetic resonance imaging protocol. A blade of magnetic resonance data as used herein encompasses a rectilinear sampling of k-space. In PROPELLER magnetic resonance imaging protocols multiple groups of k-space each of which are acquired as a rectilinear block are rotated with respect to each other. The central region of k-space is then over-sampled. The k-space of the various blades can be compared to each other either in k-space or an image space to account for translation of the subject during the acquisition of the entire magnetic resonance data.

The pulse sequence data is further configured such that the multiple blades of magnetic resonance data comprises coil-specific magnetic resonance data acquired for each of the multiple antenna elements simultaneously. In other words each of the multiple blades of magnetic resonance data is acquired using a parallel imaging technique.

Execution of the machine-executable instructions causes the processor to acquire the multiple blades of magnetic resonance data using the pulse sequence data to control the magnetic resonance imaging system. Execution of the machine-executable instructions further cause the processor to for each of the multiple blades of magnetic resonance data reconstruct a blade image using the coil-specific magnetic resonance data for each of the antenna elements according to a parallel image magnetic resonance imaging protocol. Each of the blades of magnetic resonance data is acquired using multiple antenna elements.

The parallel imaging magnetic resonance imaging protocol may use the set of coil sensitivities to combine each of the measured coil images (reconstructed from the coil specific magnetic resonance data) into a complete blade image.

Execution of the instructions further causes the processor to construct a Chi map for the blade image using the set of coil sensitivities, the blade image, and the coil specific magnetic resonance data. The Chi map comprises a voxel for each voxel in the blade image. Each voxel of the Chi map is descriptive of the probability that the voxel of the blade image contains an artifact.

This embodiment may be beneficial because the construction of the Chi map provides a measure of how reliable each blade image is. This may be used to assess whether a particular blade image or particular portions of the blade image are corrupted. In particular if the set of coil sensitivities is incorrect then there may be artifacts or reconstruction errors in the blade images. The Chi map may therefore be used as an indication or a quantity which can be examined to determine if the set of coil sensitivities is incorrect or if particular blade images are incorrect.

The Chi map can be thresholded or the individual values can be used as a weighting or a probability for later calculations such as improving the set of coil sensitivities or for performing image correction.

The Chi map can be calculated in k-space or an image space. In image space one converts the coil magnetic resonance data into an image space and then makes the comparison. In k-space the blade image is converted to k-space and compared against the individual values in k-space and then this map can be converted back into image space.

In another embodiment, execution of the machine-executable instructions further cause the processor to perform for each of the multiple blades of magnetic resonance data the step of reconstructing a measured coil image for each of the multiple antenna elements using the coil-specific magnetic resonance data. The data acquired with each antenna element for a particular blade is reconstructed into an image for that particular coil element. Execution of the machine-executable instructions further cause the processor to perform for each of the multiple blade images the step of constructing a reference coil image for each of the multiple antenna elements by backfolding the blade image using the set of coil sensitivities. The blade image was constructed from all of the measured coil images for a particular blade. The reference coil image is then calculated using the blade image. This may be done for example by performing a matrix or vector multiplication of the coils sensitivities by the blade image. In a parallel imaging technique the measurements from each of the antenna elements can be "folded" into a single image using the set of coil sensitivities. In "backfolding," the opposite operation is performed. Starting with an image the coil sensitivities are used to calculate the likely value of the measured image from just a single coil element. This reference coil image or backfolded image could be manipulated in image space or a Fourier transform could be used to transform the backfolded image into k-space. The reference coil image can be compared to the measured coil image for a particular antenna element. This comparison is performed by constructing a so called Chi map.

The calculation of the reference coil image may also be referred to as back projecting and this is taking the image or the blade image and multiplying by the coil sensitivity matrix to determine what the measurement would be like if the coil sensitivity matrix was correct. This allows the creation of a reference measurement and hence it is only needed to use the same sampling pattern which was applied during the acquisition. For SENSE this is easily done in the image space by using the SENSE equation M is equal to S×p where the multiple pixels of p of the final image fold on top of each other to make up a single measurement Execution of the machine-executable instructions further cause the processor to for each of the multiple blades of magnetic resonance data construct a Chi map for the blade image by taking a norm of the difference between the measured coil image and the reference coil image for each of the multiple antenna elements. In constructing the Chi map, the pixels or voxels of both the measured coil image and the reference coil image are compared. A norm as used herein is a mathematical operation that assigns a strictly positive length or size. This comparison is done on a pixel-by-pixel basis. The taking of the norm as used herein is comparable to taking the norm of a vector. This is because there are a number of antenna elements. In each pixel in the Chi map there is a comparison for the measured coil image and the reference coil image. Each pixel or voxel of the Chi map is therefore a norm taken for each of the multiple antenna elements and the associated measured coil image and the reference coil image for each of those.

In another embodiment the Chi map calculated using the formula hi=$\Sigma_i$Norm($m_i$–$S_i$p),
where i represents a coil element chosen from the multiple coil elements, $S_i$ is the coil sensitivity encoding matrix for coil element i, $m_i$ is the measured coil image for the coil element i, and p is the blade image. In the following equation it should be noted that the quantity ($m_i$–$s_i$p) does not matter. The norm produces a positive value in any case. Norm represents a norm taken from the quantity.

In another embodiment the norm is any one of the following: the absolute value, the mean square, and the mean square.

In another embodiment execution of the machine-executable instructions further causes the processor to calculate a k-space blade data by transforming each blade image to k-space for each of the multiple blades of magnetic resonance data.

In another embodiment execution of the instructions further cause the processor to make a low-resolution blade image for each of the multiple blades of the magnetic resonance data by Fourier transforming a central k-space region from the k-space blade data. In a PROPELLER magnetic resonance imaging protocol the blades of magnetic resonance data are acquired in rectilinear blocks which are rotated with respect to each other. The central k-space region is understood to be the k-space region which is sampled by all of the multiple blades. The blade image is a low-resolution blade image because a reduced set of the k-space data is used to construct it. The rectilinear portions of k-space in each of the blades is rotated with respect to each other so that not exactly the same k-space data is acquired but the data acquired from each one is comparable because it is from a similar spatial region within k-space.

The low-resolution blade image had a specified resolution. The specified resolution as used herein encompasses particular dimensions specified in pixels or voxels. Execution of the instructions further cause the processor to create a low-resolution Chi map for each of the blade images by mapping the Chi map for each blade image to the specified resolution. The Chi map for each of the blade images is at a higher resolution. The low-resolution Chi map for each of the multiple blades can be created by mapping the higher resolution Chi map to the lower one. This is comparable and may be performed in the same way as reducing the resolution of an image. Different means may be used to interpolate or approximate the values in the low-resolution Chi map. Standard imaging processing techniques may be used. This embodiment may be beneficial because it produces a Chi map for the low-resolution blade images. This may allow the comparison of the low-resolution blade images taking into account errors or artifacts present in particular low-resolution blade images.

In another embodiment, execution of the instructions further cause the processor to calculate corrected k-space data by performing a modified PROPELLER motion correction using the k-space transform blade image and the low-resolution Chi map for each of the multiple blades. The PROPELLER motion correction refers to the correct of the k-space data using a technique according to the PROPELLER magnetic resonance imaging protocol. The shift of the k-space data and the PROPELLER motion correction may account for translation or rotation. The PROPELLER motion correction is modified because the low-resolution Chi map is used in the motion correction. The low-resolution Chi map may for instance be used to identify pixels to ignore in particular low-resolution blade images or may be used to weight the significance of particular pixels. For instance pixels which are determined to have a low probability of having a error or artifact may be given more weight than pixels which have a high probability of having an error or an artifact.

In another embodiment execution of the instructions further causes the processor to reconstruct a magnetic resonance image using the corrected k-space data. This embodiment may be beneficial because it creates a magnetic resonance image which may be more accurate.

In another embodiment execution of the instructions further cause the processor to perform the modified PROPELLER motion correction by iteratively comparing the low-resolution blade image for each of the multiple blades of magnetic resonance data with all other of the low-resolution blade images for each of the multiple blades of magnetic resonance data. The modified PROPELLER motion correction incorporates an analysis of the low-resolution Chi map for each of the multiple blades of magnetic resonance data.

In another embodiment the modified PROPELLER motion correction incorporates the low-resolution Chi map by ignoring a pixel in the low-resolution blade image if a corresponding pixel in the low-resolution Chi map is above a predetermined threshold. For example thresholding the low-resolution Chi map could be used to determine a set of so-called bad pixels in each of the low-resolution PROPELLER image and then when the various low-resolution blade images are compared these pixels are ignored in the comparison so they do not affect the matching of the translation and/or rotation of the images.

In another embodiment the modified PROPELLER motion correction incorporates the low-resolution Chi map by weighting pixels of the low-resolution blade image during the iterative comparison using the values of the corresponding pixels in the low-resolution Chi map. This may be beneficial because pixels or voxels in the low-resolution images are given less weight if indicated by the Chi map.

In another embodiment execution of the instructions further causes the processor to calculate an artifact-free low-resolution image by averaging the low-resolution image for each blade. Execution of the instructions further cause the processor to weigh the contribution from each pixel of each low-resolution blade image using the low-resolution Chi map for each of the low-resolution blade images. There are different ways of achieving this but one way for the sake of example is to simply add each of the low-resolution blade images and use the Chi map for each low-resolution blade image as a weighting factor for the average.

This embodiment may be particularly beneficial because it may enable the construction of a more accurate low-resolution image. This image may be used for comparing other acquired data or images too for example for the calculation of a coil sensitivity map.

In another embodiment execution of the instructions further causes the processor to calculate a corrected coil sensitivity map for each of the multiple antenna elements using the artifact-free low-resolution image. This embodiment may be particularly beneficial because a corrected coil sensitivity map is calculated for each of the multiple antenna elements. This may be used in future measurements or it may be used to correct the already acquired magnetic resonance data. The corrected coil sensitivity map for each of the multiple antenna elements may be used to construct a corrected set of coil sensitivities for the multiple antenna elements. For instance the corrected set of coil sensitivities may be substituted for the set of coil sensitivities and the analysis of magnetic resonance data may be performed again using a more accurate set of coil sensitivities. The set of coil sensitivities may also be referred to as a set of coil sensitivity maps.

Execution of the instructions further cause the processor to replace the set of coil sensitivities using the corrected coil sensitivity map for each of the multiple antenna elements. Execution of the instructions further causes the processor to repeat the following steps for each of the multiple blades of magnetic resonance data after replacing the coil sensitivity map: reconstruct the measured coil image for each of the multiple antenna elements using the coil-specific magnetic resonance data, reconstruct the blade image using the coil-specific magnetic resonance data for each of the multiple antenna elements, construct the reference coil image for each of the multiple antenna elements by multiplying the set of coil sensitivities by the blade image, construct the Chi map for the blade image by summing the norm of the measured coil image and the reference coil image for each of the multiple antenna elements, and calculate the k-space transform blade image by transforming each blade image to k-space.

The previous steps may be repeated multiple times in conjunction with reconstructing the low-resolution Chi maps and low-resolution images to iteratively recalculate the set of coil sensitivities over and over again. This may be used to converge to a set of coil sensitivities which are consistent with the measurements. This may for instance be performed a set number of times or some sort of measure or statistical measure may be used to gauge if the set of coil sensitivities is converging to a particular value or values. Execution of the instructions further cause the processor to calculate final k-space data by performing a conventional PROPELLER motion correction using the k-space transform blade image after replacing the coil sensitivity map. Execution of the instructions further cause the processor to calculate a final magnetic resonance image using the final k-space data. The PROPELLER motion correction may be considered to be a conventional PROPELLER motion correction, because the Chi maps are not used in the PROPELLER motion correction. The set of coil sensitivities was corrected so the construction of the low-resolution Chi maps is not necessary when performing the PROPELLER motion correction.

In another embodiment the parallel-imaging magnetic resonance imaging protocol is any one of the following: a SENSE protocol, a GRAPPA protocol, and a hybrid SENSE-GRAPPA protocol.

In another aspect the invention provides for a method of operating the magnetic resonance imaging system. The magnetic resonance imaging system is configured for acquiring magnetic resonance data from an imaging zone. The magnetic resonance imaging system comprises a radio-frequency system for acquiring the magnetic resonance data. The radio-frequency system comprises a magnetic resonance antenna with multiple antenna elements. The magnetic resonance imaging system is configured to acquire the magnetic resonance data as multiple blades of magnetic resonance data according to a PROPELLER magnetic resonance imaging protocol. The magnetic resonance imaging system is further configured such that the multiple blades of magnetic resonance data comprise coil-specific magnetic resonance data acquired for each of the multiple antenna elements simultaneously. The method comprises the step of acquiring the multiple blades of magnetic resonance data using pulse sequence data to control the magnetic resonance imaging system. The pulse sequence data is configured to cause the processor to acquire the magnetic resonance data as the multiple blades of magnetic resonance data according to the PROPELLER magnetic resonance imaging protocol.

The method further comprises performing the following step for each of the blades of magnetic resonance data which is to reconstruct a measured coil image for each of the multiple antenna elements using the coil-specific magnetic resonance data. The method further comprises performing for each of the multiple antenna blades the step of reconstructing a blade image using the coil-specific magnetic resonance data for each of the multiple antenna elements according to a parallel imaging magnetic resonance imaging protocol. The method further comprises performing for each of the blades of magnetic resonance data the step of constructing a reference image coil for each of the multiple antenna elements by multiplying a set of coil sensitivities by the blade image. The method further comprises for each of the blades of magnetic resonance data the step of constructing a Chi map for the blade image by taking a norm of the difference between the measured coil image and the reference coil image for each of the multiple antenna elements.

In another aspect the invention provides for a computer program product comprising machine-executable instructions for execution by a processor for controlling the magnetic resonance imaging system. The magnetic resonance imaging system is configured for acquiring magnetic resonance data from an imaging zone. The magnetic resonance imaging system comprises a radio-frequency system for acquiring the magnetic resonance data. The radio-frequency system further comprises a memory containing pulse sequence data, a set of coil sensitivities for the multiple antenna elements. The pulse sequence data is configured to cause the processor to acquire the magnetic resonance data as multiple blades of magnetic resonance data according to a PROPELLER magnetic resonance imaging protocol. The pulse sequence data is further configured such that the multiple blades of magnetic resonance data comprises coil-specific magnetic resonance data acquired for each of the multiple antenna elements simultaneously.

Execution of the machine-executable instructions further causes the processor to acquire the multiple blades of magnetic resonance data using the pulse sequence data to control the magnetic resonance imaging system. Execution of the machine-executable instructions causes the processor for each of the multiple blades of magnetic resonance data to reconstruct a measured coil image for each of the multiple antenna elements using the coil-specific magnetic resonance data. Execution of the machine-executable instructions further causes the processor for each of the multiple blades of magnetic resonance data to reconstruct a blade image using the coil-specific magnetic resonance data for each of the multiple antenna elements according to a parallel imaging magnetic resonance imaging protocol. Execution of the instructions further cause the processor to perform for each of the multiple blades of magnetic resonance data the constructing of a reference coil image for each of the multiple antenna elements by multiplying the set of coil sensitivities by the blade image. Execution of the instructions further cause the processor to for each of the multiple blades of magnetic resonance data perform the step of constructing a Chi map for the blade image by taking a norm of the difference between the measured coil image and the reference coil image for each of the multiple antenna elements.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
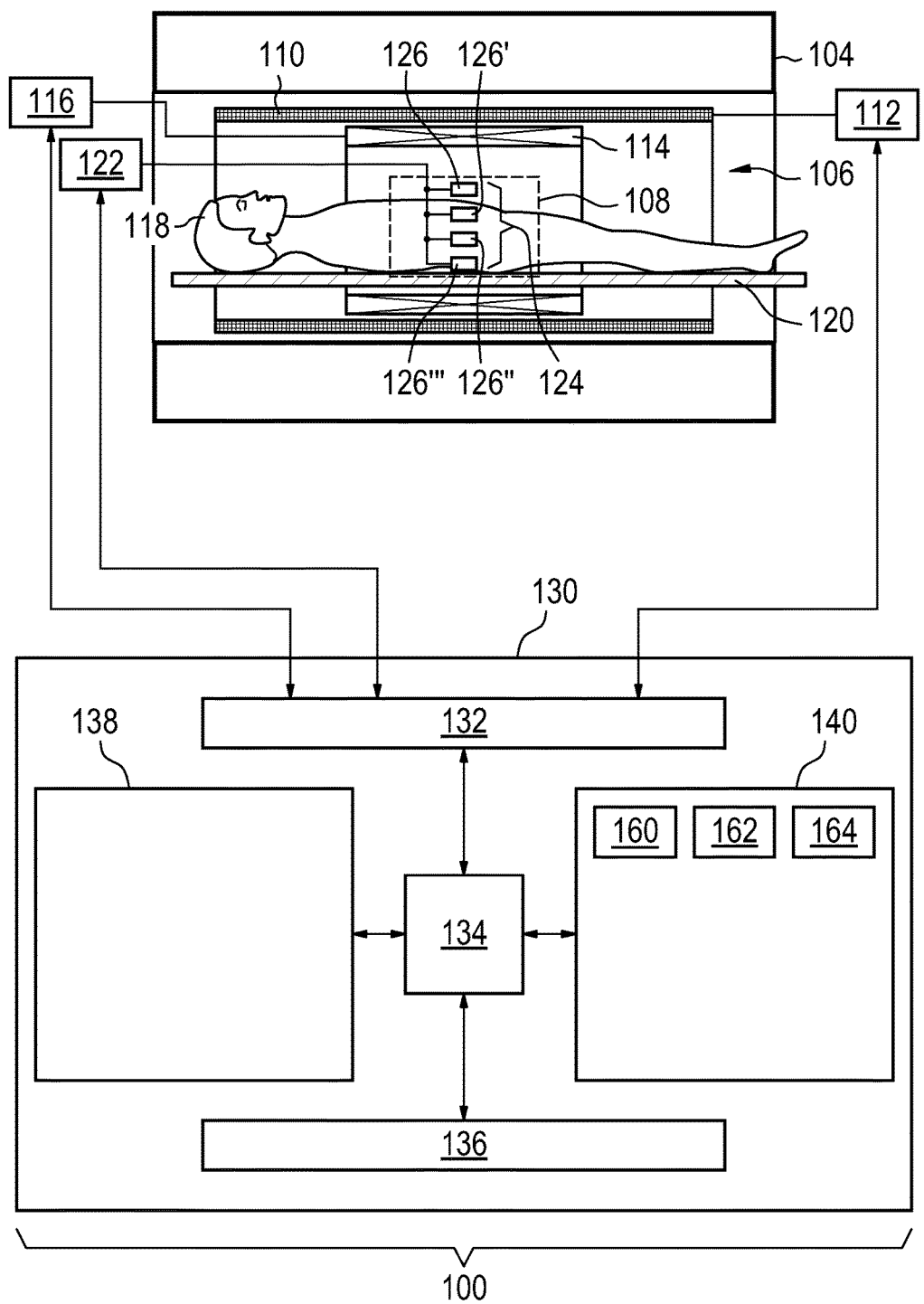
FIG. 1 illustrates an example of a magnetic resonance imaging system.

FIG. 1 shows an example of a magnetic resonance imaging system with a magnet 104. The magnet 104 is a superconducting cylindrical type magnet 104 with a bore 106 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Within the bore 106 of the magnet 104 is an optional body coil 114. The body coil 114 is shown as being connected to a transceiver 116. In some embodiments body coil 114 may also be connected to a whole body coil radio frequency amplifier and/or receiver, however this is not shown in this example. If both a transmitter and a receiver are connected to the whole body coil 114, a means for switching between the transmit and receive mode may be provided. For example a circuit with a pin diode may be used to select the transmit or receive mode. A subject support 120 supports a subject 118 within the imaging zone.

A transceiver 122 is shown as being connected to a magnetic resonance imaging antenna 124. In this example the magnetic resonance imaging coil 124 is a surface coil comprising multiple antenna elements 126, 126', 126", 126'''. The transceiver 122 is operable for sending and receiving individual RF signals to the individual coil elements 126, 126', 126'', 126'''. In this example the transceiver 116 and the transceiver 122 are shown as being separate units. However, in other examples the units 116 and 122 could be combined.

The magnetic resonance imaging system comprises a computer system 130. The transceiver 116, the transceiver 122, and the magnetic field gradient coil power supply are shown as being connected to a hardware interface 132 of the computer 130. The computer 130 is further shown as containing a processor 134 which is operable for executing the machine-readable instructions. The computer 130 is further shown as comprising a user interface 136, computer storage 138 and computer memory 140 which are all accessible and connected to the processor 134.

Figure 1A:
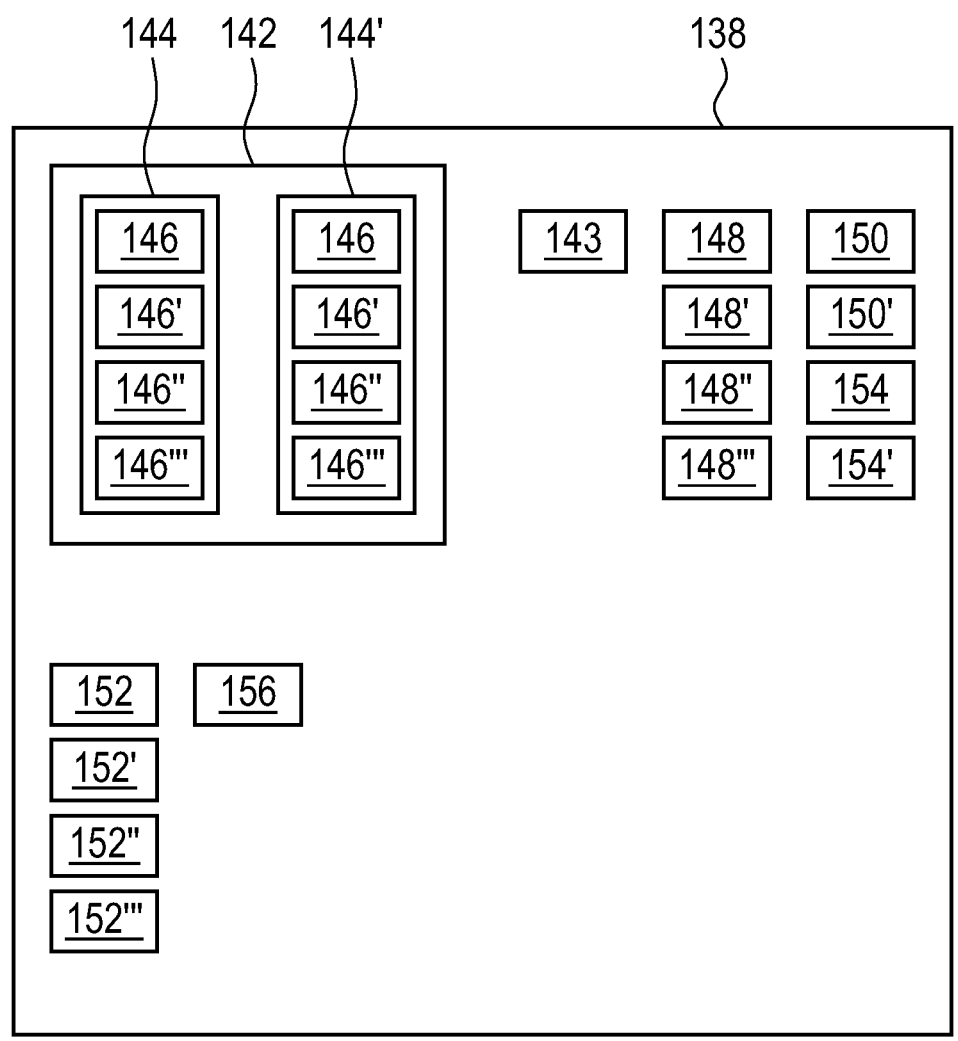
FIG. 1A illustrates the contents of computer storage.

The computer storage 138 is illustrated in FIG. 1A and is shown as containing magnetic resonance data 142 acquired according to pulse sequence data 143. The pulse sequence data 143 enables the processor 134 to acquire the magnetic resonance data 142 according to a PROPELLER magnetic resonance imaging protocol. The magnetic resonance data 142 is shown as comprising multiple blades 144, 144' of magnetic resonance data. In this Fig. two blades, 144, 144' are shown. It is understood however that the number of blades will be represented by the number of blades in a particular magnetic resonance imaging protocol. Each blade 144, 144' is shown as containing coil-specific magnetic resonance data 146, 146', 146'', 146''' corresponding to each of the antenna elements 126, 126', 126'', 126'''. Data 146 was acquired using antenna element 126. Magnetic resonance data 146' was acquired using antenna element 126'. Coil-specific magnetic resonance data 146'' was acquired using antenna element 126''. Coil-specific magnetic resonance data 146' was acquired using antenna element 126'. The computer storage 138 is further shown as containing a number of measured coil images 148, 148', 148'', 148'''.

There will be a measured coiled image 148, 148', 148'', 148''' for each blade 144, 144'. An image 148, 148', 148'', 148' is only shown as representative for the blade 144. Coil-specific magnetic resonance data 146 was used to reconstruct image 148. Coil-specific magnetic resonance data 146' was used to reconstruct measured coil image 148'. Coil-specific magnetic resonance data 146'' was used to reconstruct measured coil image 148'' and coil-specific magnetic resonance data 146''' was used to reconstruct measured coil image 148'. The measured coil images 148, 148', 148'' and 148' were used to reconstruct a blade image 150 which is also shown as being stored in the computer storage 138. Likewise, blade image 150' was reconstructed from its magnetic resonance data. The computer storage 138 is shown as further containing a set of coil sensitivities 156 for the antenna elements 126, 126', 126'', 126'''. A set of reference coil images 152, 152', 152'', 152' was calculated by multiplying the set of coil sensitivities 156×the blade image 150'. This could also be performed on the blade image 150'.

The computer storage 138 is further shown as containing a Chi map 154 that was constructed by comparing images 148-152, 148'-152', 148''-152'', and image 148'''-152'''. Examining a particular pixel in each of these images a norm is then used to calculate the Chi map 154. Likewise a Chi map 154' could be constructed for the blade image 150'.

The computer memory is shown as containing a control module 160 which contains computer-executable code which enables the processor 134 to control the operation and function of the magnetic resonance imaging system 100 and also to perform the analysis of the magnetic resonance data 142. The computer storage 140 is further shown as containing an image reconstruction module 162 which may enable the processor 134 to reconstruct magnetic resonance data 142 into the various images. The computer storage 140 is also shown as containing an image processing module 164 which enables the processor 134 to manipulate and perform mathematical operations on the variety of images within the computer storage 138.

Figure 2:
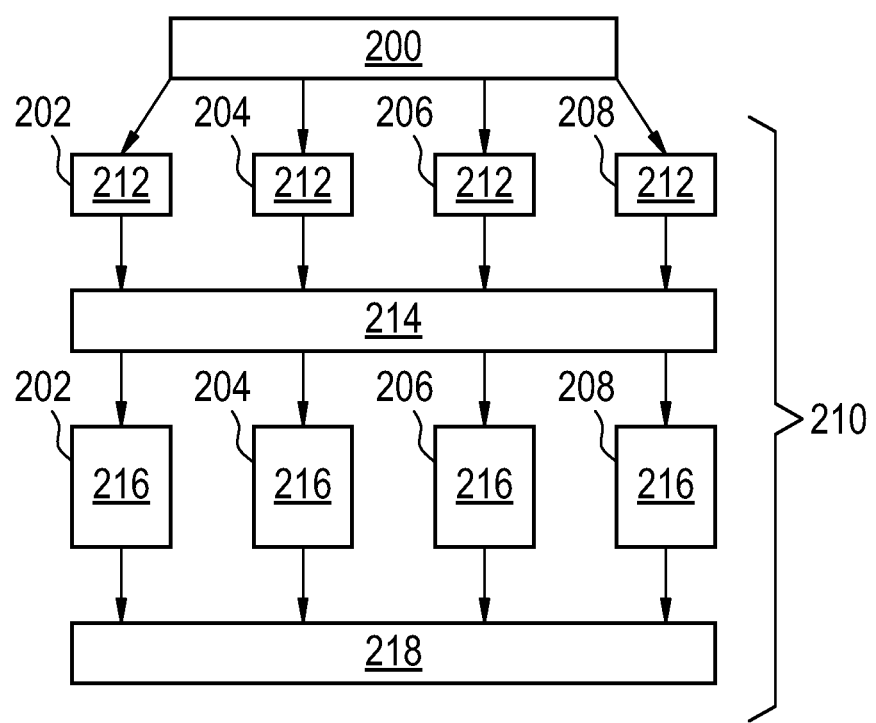
FIG. 2 illustrates a method of operating the magnetic resonance imaging system of FIG. 1.

FIG. 2 shows a block diagram which illustrates a method of operating the magnetic resonance imaging system 100 shown in FIG. 1. In the first step 200 execution of the machine-executable instructions 160, 162, 164 cause the processor 134 to acquire the magnetic resonance data 142. The method is then split into a number of branches. Step branch 202 indicates operations performed for antenna element 126. Branch 204 represents operations performed for antenna element 126'. Branch 206 represents operations performed for antenna element 126''. Branch 208 represents operations performed for antenna element 126'''. Each of these branches is then also performed for each blade of magnetic resonance data that is acquired. The block 210 is then repeated for each blade. The method is explained with reference to column 202 and the other columns are performed in an analogous manner. The method 200 then proceeds to block 212 in column 202. In block 212 a measured coil image 148 is reconstructed from the coil-specific magnetic resonance data 146. Next in step 214 a blade image 150 is reconstructed using the coil-specific magnetic resonance data for each of the multiple antenna elements 146, 146', 146'', 146''' according to a parallel imaging magnetic resonance imaging protocol. Next in step 216 a reference coil image 152 is reconstructed using the set of coil sensitivities 156 and the blade image 150. Next in step 218 a Chi map 154 is constructed by taking a norm of the difference between the measured coiled image 148, 148', 148'', 148''' and the reference coil image 152, 152', 152'', 152''' for each of the multiple antenna elements 426, 426', 426'', 426'''.

Figure 3:
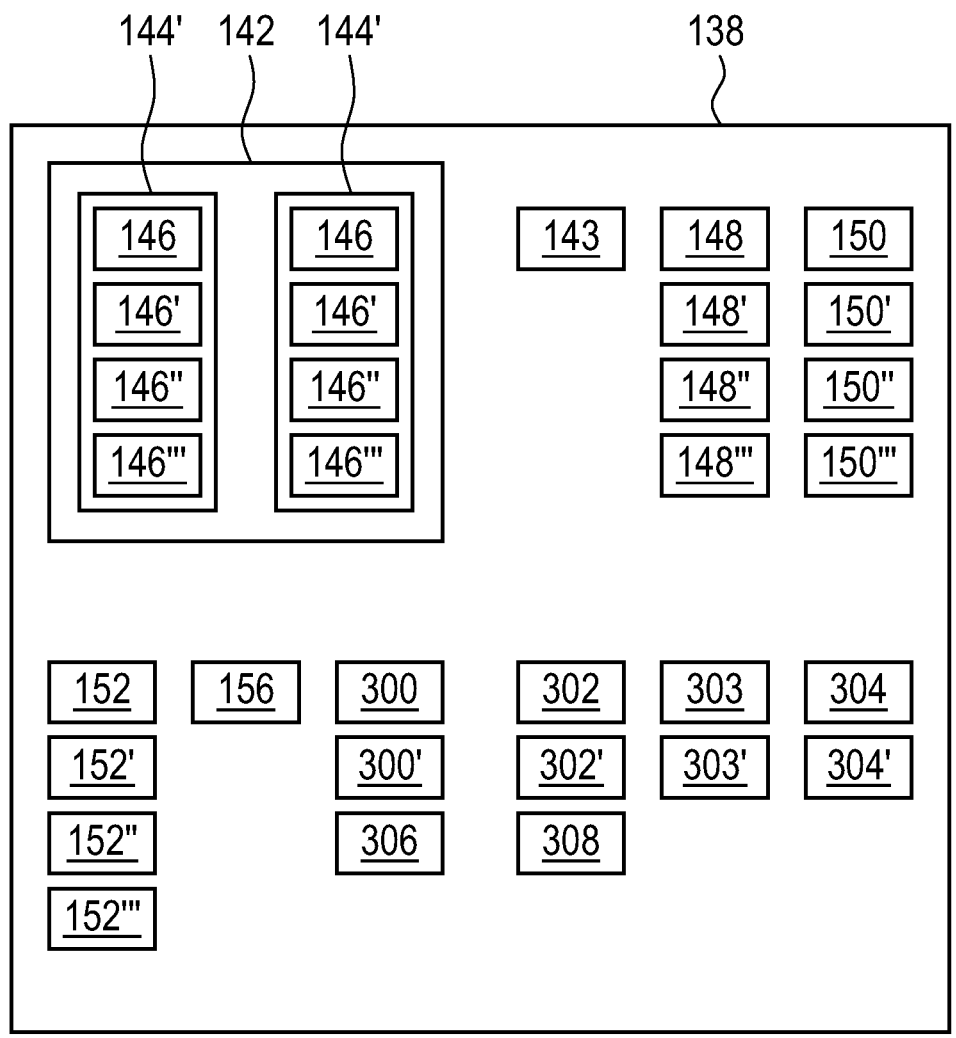
FIG. 3 illustrates alternative contents of the computer storage.

FIG. 3 illustrates a further example of the magnetic resonance imaging system 100. In this example the computer storage 138 is shown as containing additional data. The functionality of the control module is also expanded. The computer storage 138 is shown as additionally containing k-space blade data 300 that is constructed from blade image 150. The computer storage 138 is further shown as containing k-space blade data 300' which was reconstructed from blade image 150'. Elements 300 and 300' are k-space data that was reconstructed from the respective blade images 150 and 150'. The computer storage 138 is shown as containing a region of central k-space 302 and 302' that were extracted from the k-space data 300 and 300' respectively. The computer storage 138 is additionally shown as containing a low resolution blade image 303 reconstructed from 302 and a low resolution blade image 303' reconstructed from 302'. The computer storage 138 is shown as additionally containing a low-resolution Chi map 304 reconstructed from Chi map 154 and a low-resolution Chi map 304' reconstructed from Chi map 154'. The computer storage 138 is further shown as containing corrected k-space data 306. The computer storage is further shown as containing a magnetic resonance image 308 that was reconstructed from the corrected k-space data 306.

Figure 4:
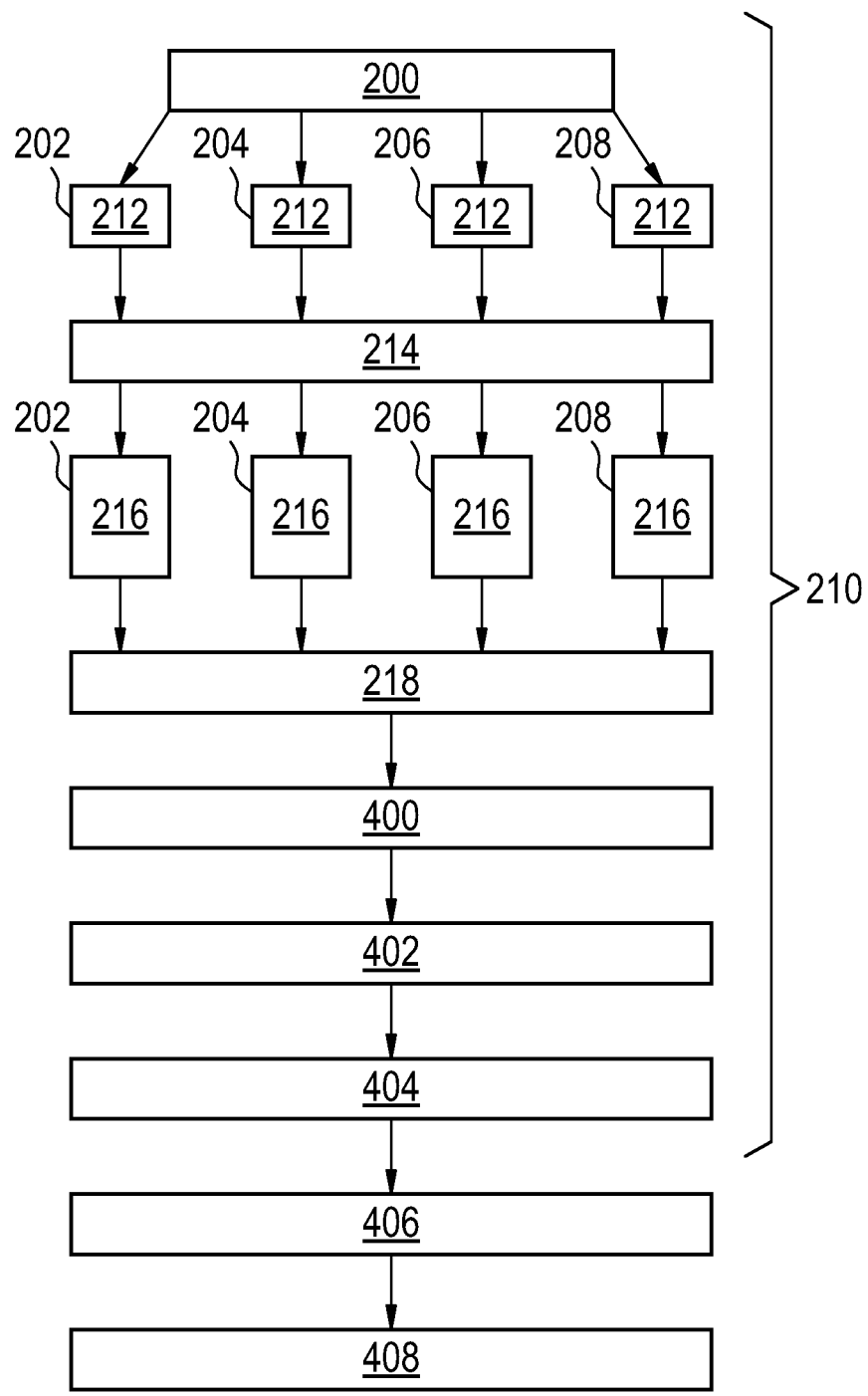
FIG. 4 illustrates an alternative method of operating the magnetic resonance imaging system of FIG. 1.

FIG. 4 shows a further example of a method for operating the magnetic resonance imaging system illustrated in FIG. 1 and FIG. 3. Continuing from step 218, the method further comprises calculating 400 a k-space transform blade image 300 from the blade image 150. Next in step 402 a low-resolution blade image 303 from a central region of k-space 302 extracted from the k-space blade data 300. Next in step 404 a low-resolution Chi map 304 is reconstructed from Chi map 154. Next in step 406 corrected k-space data 306 is calculated by performing a modified PROPELLER motion correction using the k-space blade datas 300 and 300' and the low-resolution Chi map 300, 304' for each of the multiple blades 144, 144'. Finally in step 408 a magnetic resonance image 308 is reconstructed from the corrected k-space data 306.

Figure 5:
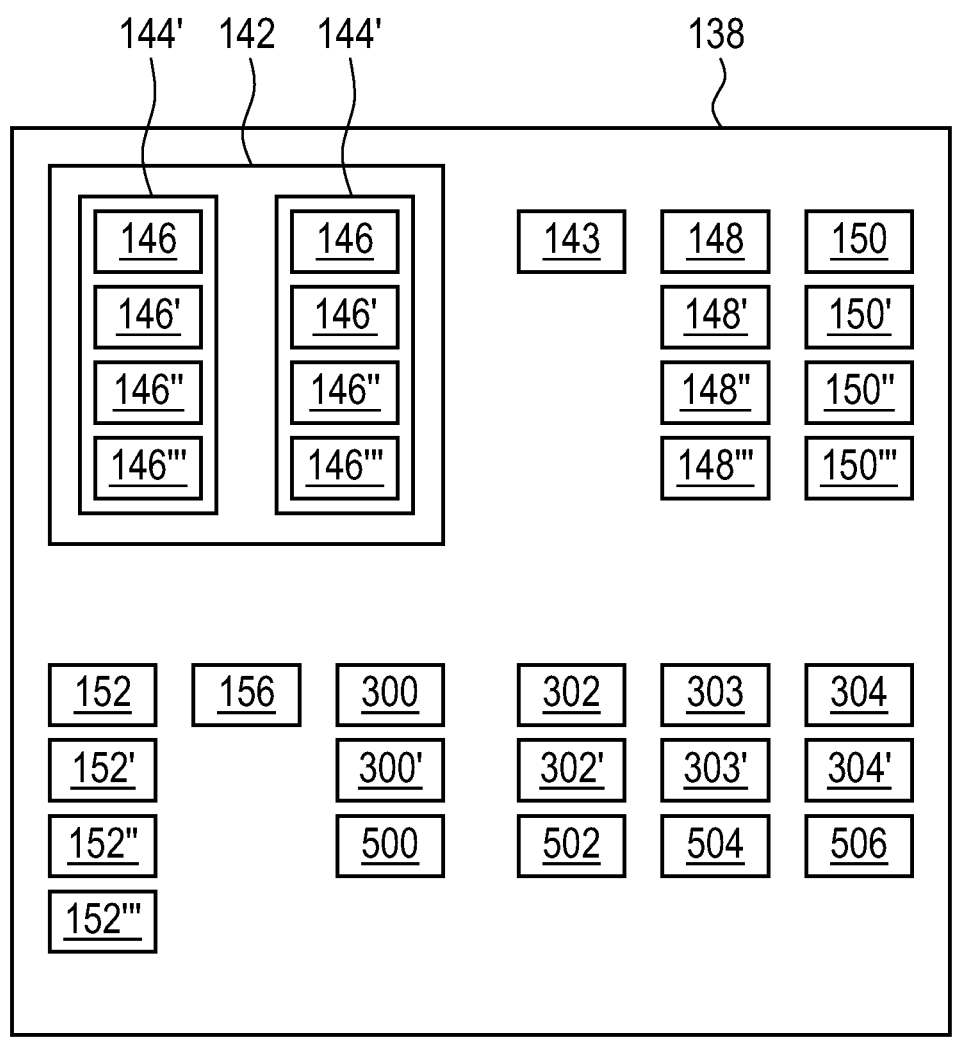
FIG. 5 illustrates alternative contents of the computer storage.

FIG. 5 shows alternative contents of the computer storage 138 for FIG. 1. This results in expanded functionality of the magnetic resonance imaging system 100 shown in FIG. 1. The functioning of the control module 160 is also expanded. The control module 160 is programmed to perform the method illustrated in FIG. 6.

The computer storage 138 is shown as additionally containing artifact-free low-resolution image 500 that was calculated by combining the low-resolution blade images 300 and 303' using the low-resolution Chi maps 304 and 304'. The use of the term 'artifact-free' is intended to be a label to distinguish a particular low-resolution image. As such the artifact-free low-resolution image may not be completely artifact-free but may in fact be a reduced artifact low-resolution image. The computer storage 138 is shown as further containing corrected coil sensitivities 502 that were calculated using the artifact-free low-resolution image 500 and the previously acquired magnetic resonance data 142. The computer storage 138 is shown as further containing final k-space data 504 by applying a PROPELLER motion correction to the magnetic resonance data 142. The computer storage is finally shown as containing a final magnetic resonance image 506 reconstructed from the final k-space data 504.

Figure 6:
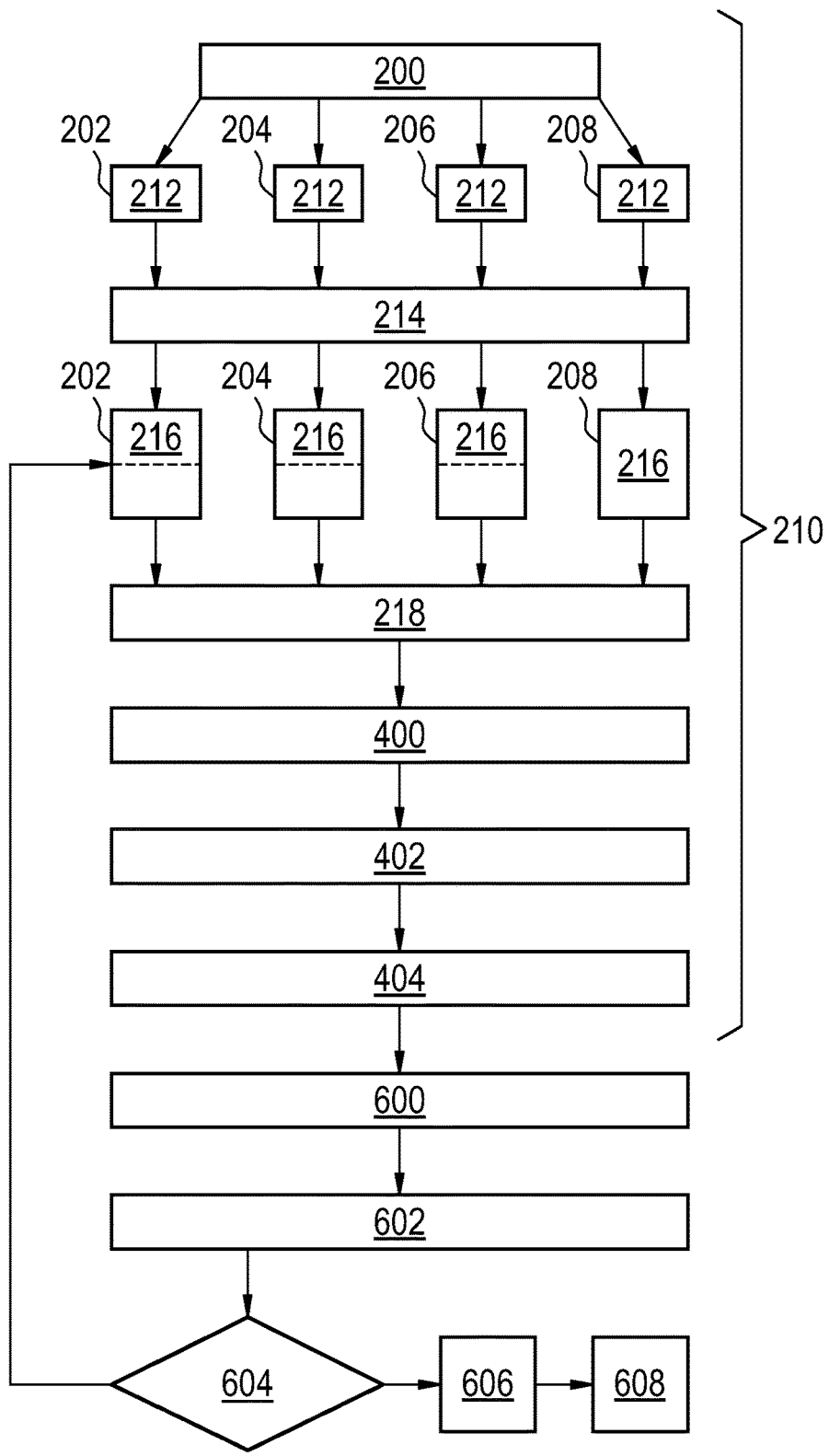
FIG. 6 illustrates an alternative method of operating the magnetic resonance imaging system of FIG. 1.

FIG. 6 shows a flowchart which shows a continuation of the method illustrated in FIG. 2. Continuing from step 218, the method further comprises calculating 400 a k-space transform blade image 300 from the blade image 150. Next in step 402 a low-resolution blade image 303 from a central region of k-space 302 extracted from the k-space blade data 300. Next in step 404 a low-resolution Chi map 304 is reconstructed from Chi map 154.

After step 404 an artifact-free low-resolution image 500 is calculated by averaging the low-resolution image 300, 303' for each blade. This is done by weighting the contribution from each pixel of each low-resolution blade image using the low-resolution Chi map 154 that is associated with each low-resolution blade image 303, 303'. Next in step 602 a corrected coil sensitivity map 502 is calculated for each of the multiple antenna elements 126, 126', 126", 126'" using the artifact-free low-resolution image 500. This for instance could be performed by dividing the artifact-free low-resolution image 500 by each of the measured coiled images 148, 148', 148", 148'". Step 604 is a decision box. For instance the method may proceed back to steps 216 and the corrected coil sensitivities 502 may be calculated repeated times. This may for instance be done a set number of times or some statistical property of the corrected coil sensitivities 502 can be compared at each iteration and a convergence criteria can be used. Step 604 is optional. Next after the coil sensitivities are calculated in step 602 the method proceeds to step 606 where final k-space data 504 is calculated using a PROPELLER motion correction. In this case the low-resolution Chi maps are not needed because the coil sensitivities have been corrected. After step 606 a final magnetic resonance image 506 is calculated using the final k-space data 504.

The PROPELLOR (or Multi-Vane) MRI systems may expanded with the ability to apply SENSE for each blade. Although this will speed up the acquisition, it can also introduce SENSE artifacts per blade. These will in turn hinder the capability of inter-blade correlations and hence will hinder the application of a proper motion correction. Moreover, the final image quality can be reduced (lower SNR after blade averaging and or remaining SENSE artifacts). Examples may make the PROPELLOR implementation more robust when SENSE is used.

Examples may use the knowledge of where the SENSE artifacts are located per blade to:

1. improve inter-blade correlations (by not taking the locations containing artifact into account)

2. generate an artifact free centre part of k-space (by applying averring in image domain where locations containing SENSE artifacts are not taken into account)

3. update coil sensitivity maps per blade such that in a subsequent SENSE unfolding one can generate artifact free blade images (or reduce artifact blade images) leading to optimal or improved image quality.

When applying these steps one can obtain the best possible, SENSE artifact free, final image. Examples may make the PROPELLOR product much more robust.

One of the big remaining issues for MR imaging is handling motion during scanning. When the patient moves during scanning the produced images will contain motion artifacts which can reduce the diagnostic quality of the images. One method for reducing the motion artefacts is a special acquisition/reconstruction technique called PROPELLOR (or Multi-Vane).

Figure 7:
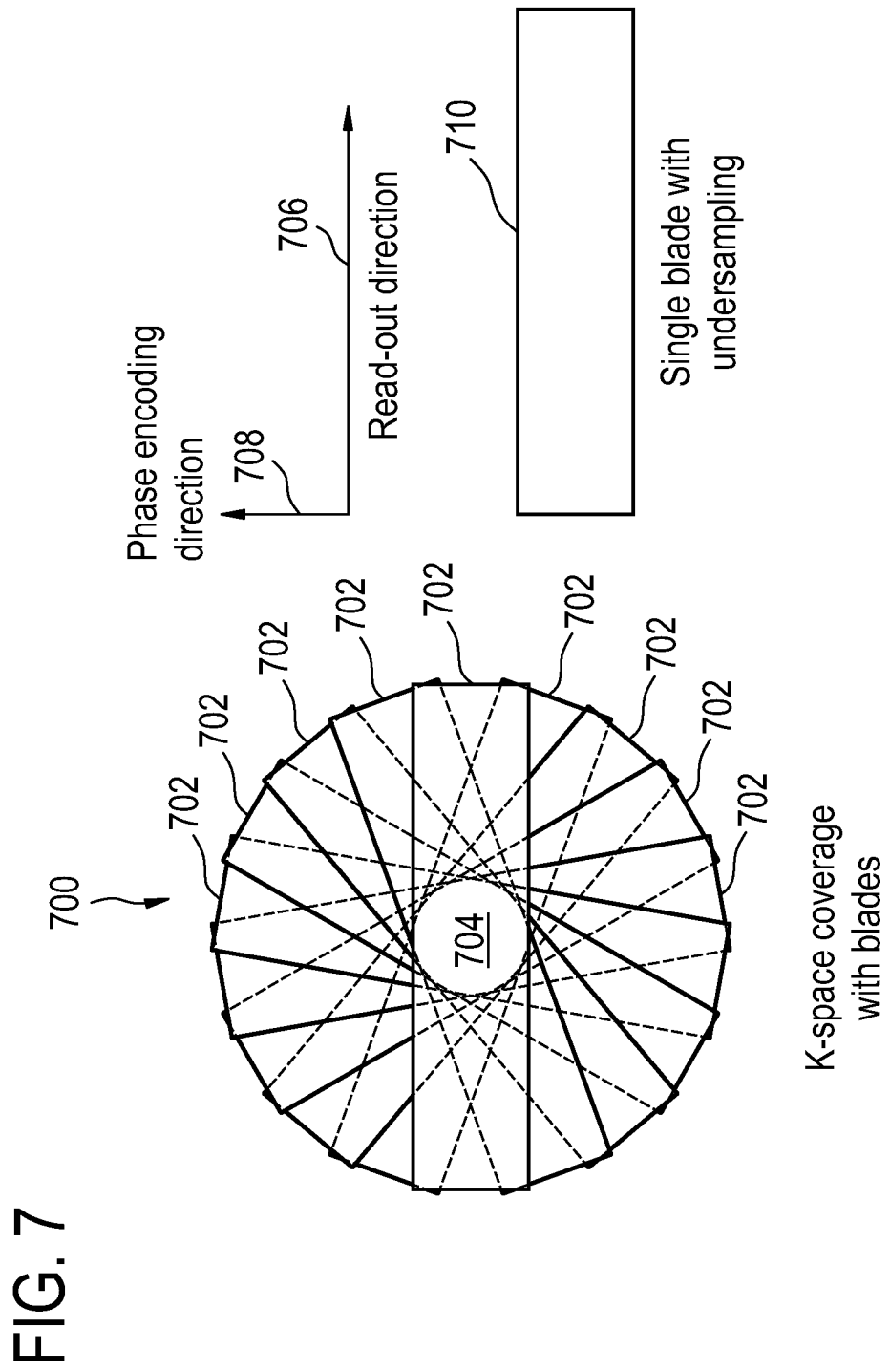
FIG. 7 illustrates the PROPELLER method.

FIG. 7 illustrates the PROPELLER method by showing the k-space coverage 700 made by multiple blades 702. There is a central region of k-space 704 which is in common to all the blades 702. Blades have a readout direction 706 and a phase encoding direction 708. 710 shows a single blade of magnetic resonance data 710 with undersampling.

When motion has occurred in between the SENSE reference scan and the clinical scan, SENSE artifact may appear in the reconstructed image. Another source of artifacts is the difference in contrast between the SENSE ref scan and the clinical scan (example are flame artifacts, FFE versus TSE). These artifacts reduce the image quality and may mask important anatomical structures. With PROPELLOR-SENSE, the individual blades (see FIG. 7) are reconstructed with SENSE and hence can have SENSE artifacts. Key here is that the location of these artifact will differ per blade (this because the phase encoding direction is different per blade, cf. FIG. 8).

Figure 8:
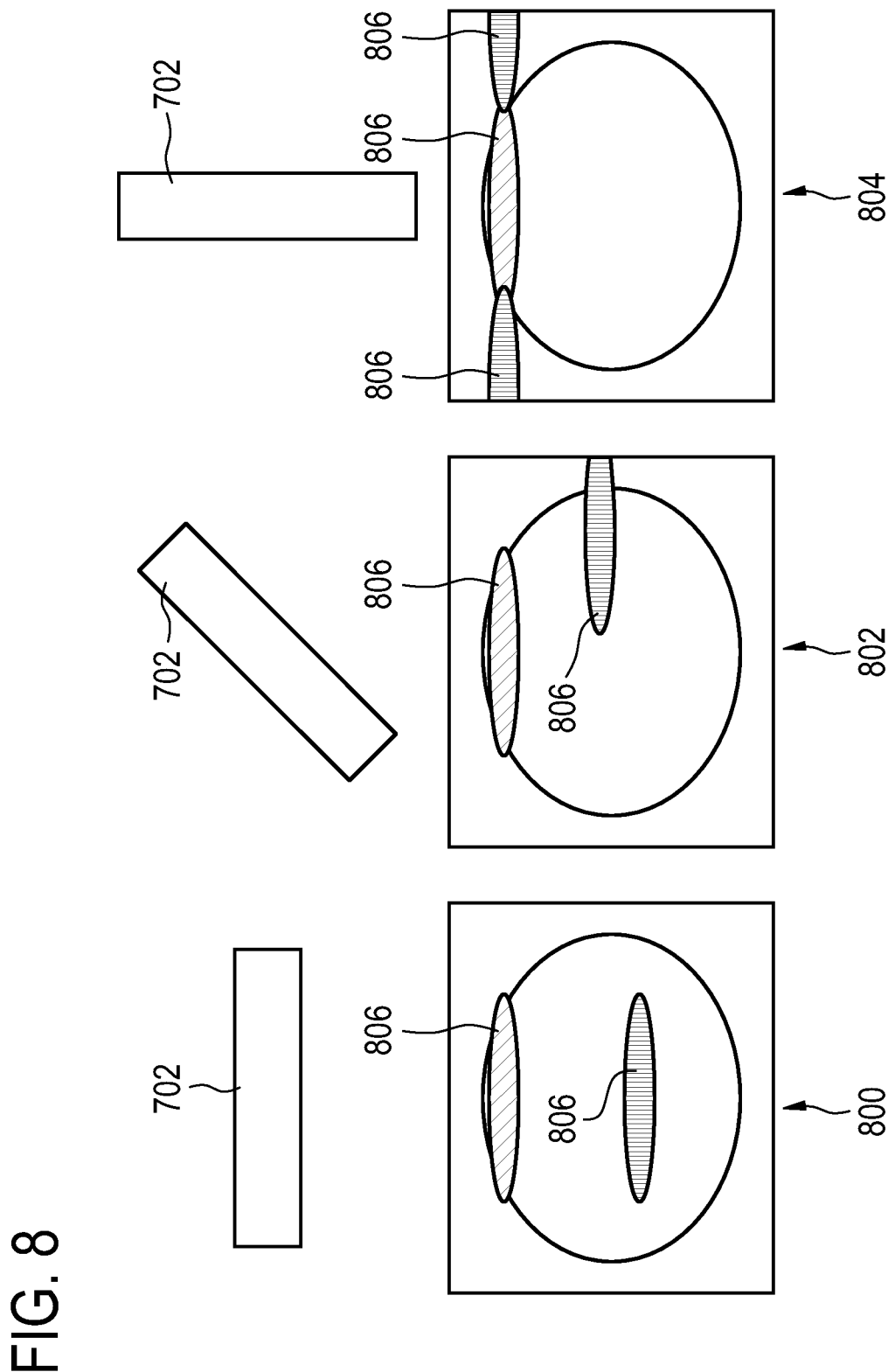
FIG. 8 illustrates three different measured coil images with artifacts in different positions due to different blade orientations.

FIG. 8 shows three different measured coil images 800, 802, 804. Each measured coil image 802, 804, 800 shows artifacts 806 in different positions. The position of the different artifacts 806 is caused by the different orientation of the particular blade 702 of magnetic resonance image. Above each image 800, 802, 804 is drawn the relative orientation of a blade 702 of magnetic resonance imaging. FIG. 8 illustrates how the different measured coiled images 800, 802, 804 will have the artifacts 806 in different locations within the image. Located in the artifact 806 within each image may enable the reconstruction of an artifact-free low-resolution image.

Next to reducing the image quality, these artifacts also hamper the inter-blade correlation because the manifestation of the SENSE artifacts is different per blade. So in total, any SENSE artifact will reduce the overall effectiveness of PROPELLOR and will therefore reduce the final image quality.

Examples may provide a method to resolve the negative effects of the SENSE artifacts. With SENSE one can identify the locations containing SENSE artefacts via the so-called Chi map. This map is made by projecting the SENSE output back onto the measurement space and then determine the mean squared error of the difference between the projection and the true measurements:

$$Chi=MSE(m-Sp),$$

where m are the measurements in image domain, S is a coil sensitivity matrix containing the coil sensitivity map values for all the unfolded positions in image domain, and p is the vector containing the pixel values at the unfolded locations in image domain.

The Chi map will 'highlight' the locations containing any inconsistencies, i.e. containing SENSE artifacts. Note that if at a certain location in the image domain an error is made resulting in SENSE artifacts, e.g. the coil sensitivity map is incorrectly estimated, then locations at an integer times the folding distance (in the phase encoding directions) also contain SENSE artifacts (see FIG. 8). When performing multiple scans in a row with each having the same phase encoding direction, the artifacts will likely appear in roughly the same locations (the CSM error leading to the SENSE artifact is likely to be at the same location for each scan). Therefore, having, e.g., multiple NSAs will not reduce the SENSE artifacts.

In PROPELLOR however, each blade has a different phase encoding direction! Therefore, the SENSE artifacts are positioned at different locations per blade (except for the artifact at the location where the error was made) (see FIG. 8). By having knowledge of the SENSE artifact location per blade one can:

1. Improve the inter-blade correlation by not taking into account the pixels containing the SENSE artifacts. An improved correlation will also improve the motion correction capabilities of PROPELLOR.

2. Create an SENSE artifact free low resolution image or reduce artifact image. Since all blades overlap in the centre of the image, one can use the low resolution images to isolate the locations where the errors are made and create correct estimations for all the other locations.

In the case that the SENSE artifacts are caused by errors in the coil sensitivity maps one can go one step further in improving the image quality. By having the SENSE artifact free low resolution image and the ability to isolate the locations where the CSM errors are made, one can update the CSMs such that they do not contain errors anymore. By doing so, a second iteration of SENSE can be used to make each blade SENSE artifact free leading to overall improved image quality. The updating of the CSMs can be done using the following relation:

$$m=\Sigma_i S_i P_i \rightarrow S_j = (m - \Sigma_{(i \ne q_j)} s_i p_i / p_j)$$

Where the location j contains the error. Note that this equation assumes that there is only one source of error per folded location which is in general true per coil. Although this simple model is likely to suffice in practice, other more elaborate algorithms (which do not have the assumption of a single error source) are also possible.

Figure 9:
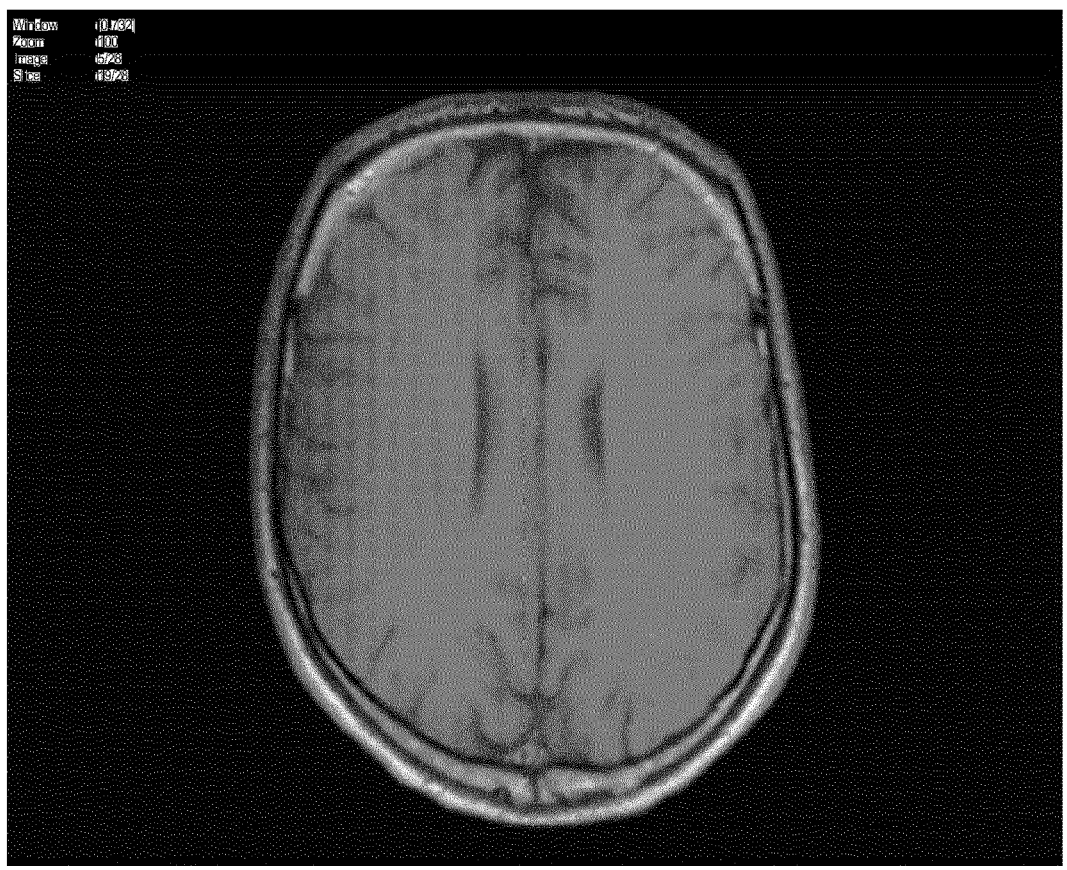
FIG. 9 shows a SENSE reconstructed image.

FIG. 9 shows an example of a SENSE reconstructed image 900 for a head scan. The SENSE reconstructed image 900 contains a number of artifacts.

Figure 10:
FIG. 10 shows a Chi map.

FIG. 10 shows a Chi map 1000 for the SENSE reconstructed image 900 of FIG. 9. The Chi map 1000 indicates the location of the artifacts shown in FIG. 900.

Figure 11:
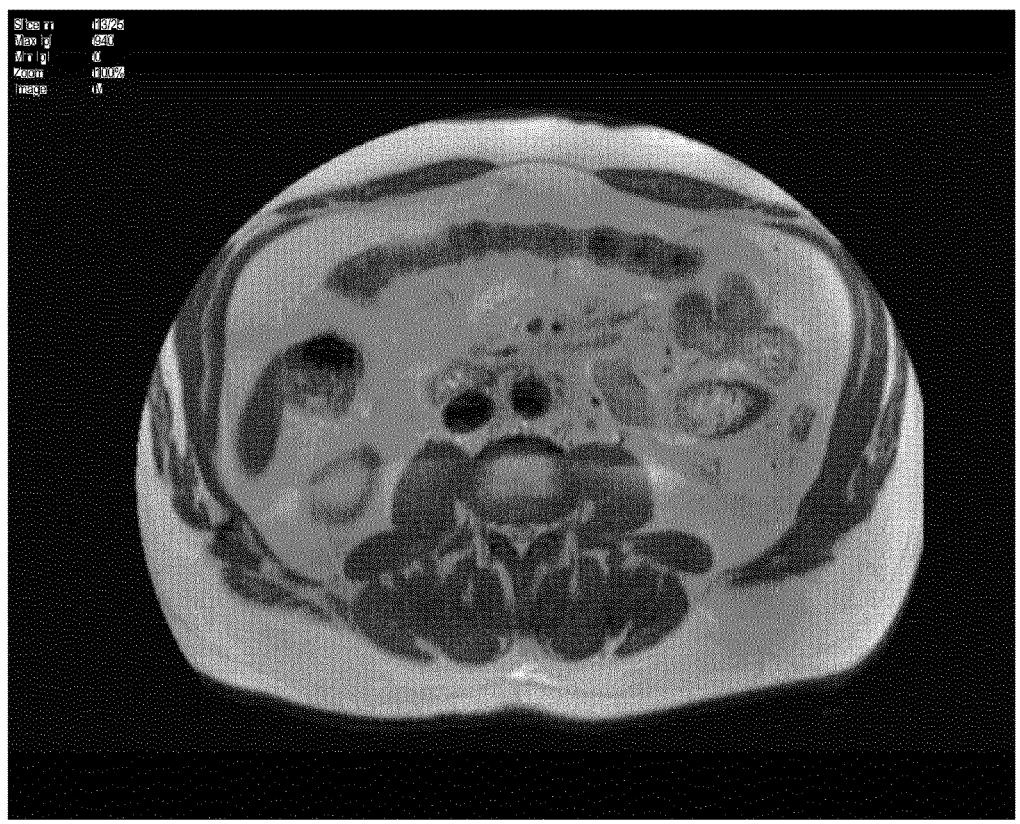
FIG. 11 shows a SENSE reconstructed image.

FIG. 11 shows another SENSE reconstructed image 1100 for transversal abdomen scan. The SENSE reconstructed image 1100 contains artifacts.

Figure 12:
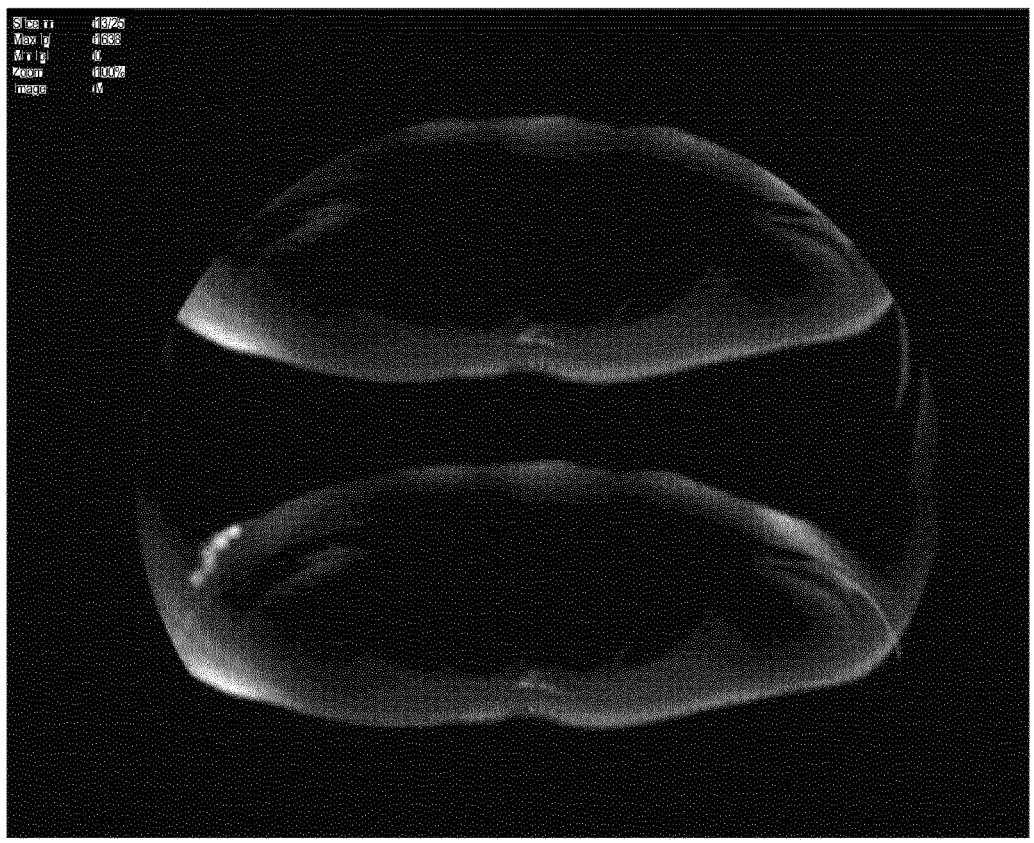
FIG. 12 shows a Chi map.

FIG. 12 shows a Chi map 1200 for FIG. 11. The Chi map 1200 indicates the location of artifacts in image 1100.

Figure 13:
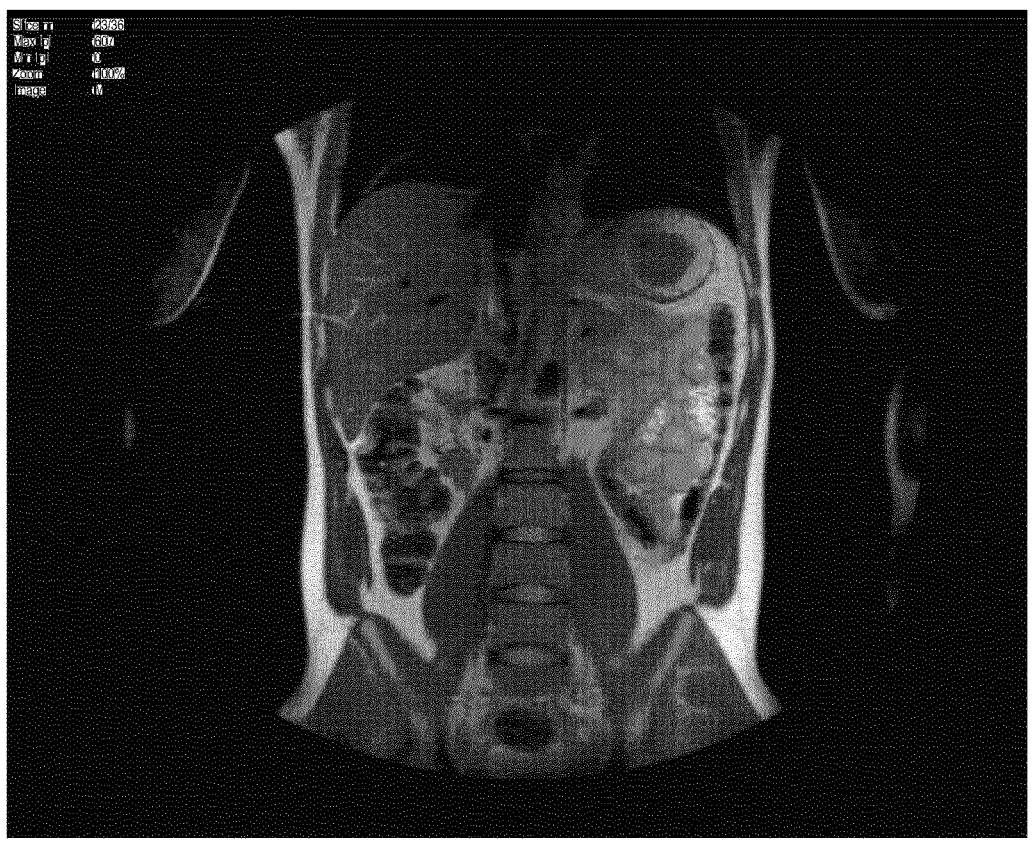
FIG. 13 shows a SENSE reconstructed image.

FIG. 13 shows a SENSE reconstructed image 1300 for a coronal abdomen scan. The SENSE reconstructed image 1300 contains artifacts.

Figure 14:
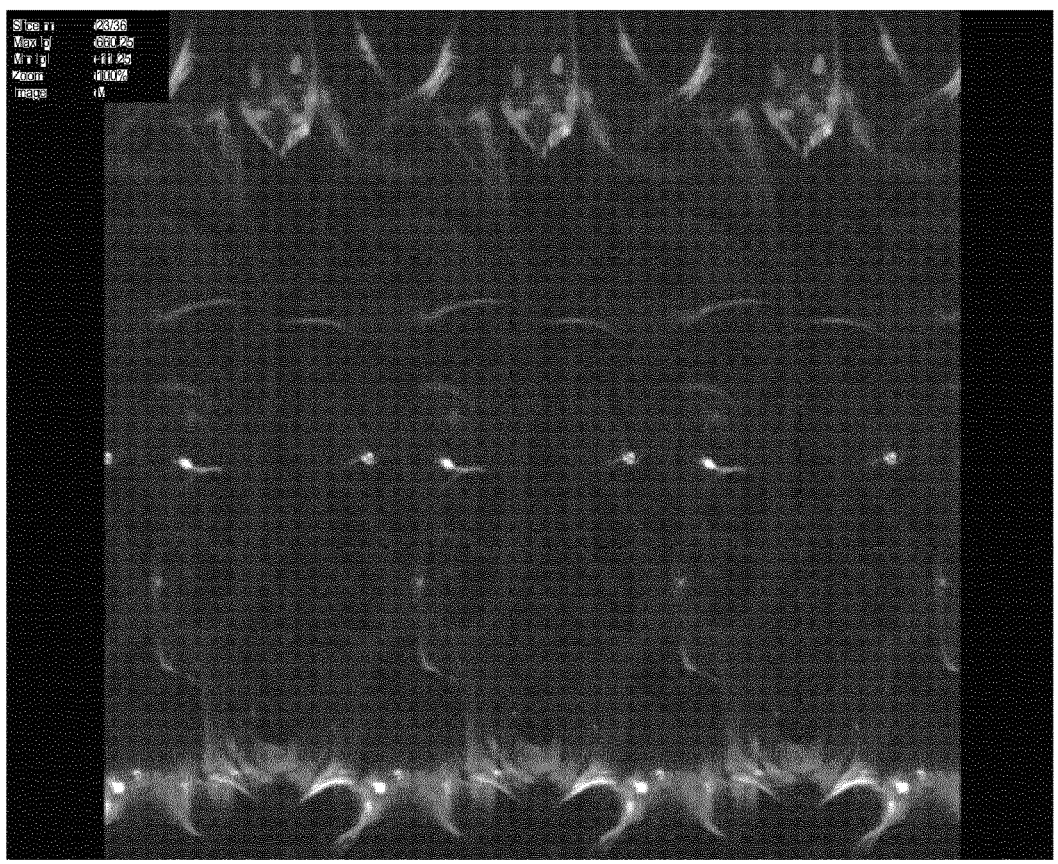
FIG. 14 shows a Chi map.

FIG. 14 shows a Chi map 1400 for image 1300. The Chi map 1400 indicates the location of artifacts in image 1300.

In the above examples a knowledge of where the SENSE artifacts are located per blade may be used to:

1. improve inter-blade correlations (by not taking the locations containing artifact into account)

2. generate an artifact free centre part of k-space (by applying averaging in image domain where locations containing SENSE artifacts are not taken into account)

3. update coil sensitivity maps per blade such that in a subsequent SENSE unfolding one can generate artifact free or artifact reduced blade images.

The optimal or improved end result may be obtained when applying the three steps in a row, but each individual step can be applied separately as well (for instance, in abdomen, the first step could be skipped since blade rotation and translation correction is typically not applied).

The knowledge of where the SENSE artifacts are located my be obtained via a projection of the unfolded image onto the measurement space and then determine the mean squared error of the difference between the projection and the true measurements.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
110 magnetic field gradient coils
112 magnetic field gradient coil power supply
114 body coil
116 transceiver
118 subject
120 subject support
122 transceiver 124 magnetic resonance image antenna
126 antenna element
126' antenna element
126" antenna element
126'" antenna element
130 computer
132 hardware interface
134 processor
136 user interface
138 computer storage
140 computer memory
142 magnetic resonance data
143 pulse sequence data
144 blade of magnetic resonance data
144' blade of magnetic resonance data
146 coil specific magnetic resonance data
146' coil specific magnetic resonance data
146" coil specific magnetic resonance data
146'" coil specific magnetic resonance data
148 measured coil image
148' measured coil image
148" measured coil image
148'" measured coil image
150 blade image
150' blade image
152 reference coil image
152' reference coil image
152" reference coil image
152'" reference coil image
154 Chi map
154' Chi map
156 set of coil sensitivities
160 control module
162 image reconstruction module
164 image processing module
200 acquire multiple blades of magnetic resonance data
202 operations for antenna element 126
204 operations for antenna element 126'
206 operations for antenna element 126"
208 operations for antenna element 126'"
210 operations performed per blade
300 k-space blade data from blade image 150
300' k-space blade data from blade image 150'
302 k-space data extracted from 300
302' k-space data extracted from 300'
303 low resolution blade image reconstructed from 302
303' low resolution blade image reconstructed from 302'
304 low resolution Chi map from Chi map 154
304' low resolution Chi map from Chi map 154'
306 corrected k-space data
308 magnetic resonance image
500 artifact-free low resolution image
502 corrected coil sensitivities
504 final k-space data
506 final magnetic resonance image
700 k-space coverage with blades
702 blade of magnetic resonance data
704 central region of k-space
706 read out direction
708 phase encoding direction
710 single blade of magnetic resonance blade
800 measured coil image
802 measure coil image
804 measured coil image
806 artifacts
900 SENSE reconstructed image
1000 Chi map
1100 SENSE reconstructed image
1200 Chi Map
1300 SENSE reconstructed image
1400 Chi map

The invention claimed is:

1. A magnetic resonance imaging system for acquiring magnetic resonance data from an imaging zone, wherein the magnetic resonance imaging system comprises:
a radio-frequency system for acquiring the magnetic resonance data, wherein the radio-frequency system comprises a magnetic resonance antenna with multiple antenna elements;
a processor for controlling the magnetic resonance imaging system; and
a memory containing pulse sequence data, a set of coil sensitivities for the multiple antenna elements, and machine executable instructions; wherein the pulse sequence data is configured to cause the processor to acquire the magnetic resonance data as multiple blades of magnetic resonance data according to a PROPELLER magnetic resonance imaging protocol; wherein the pulse sequence data is further configured such that each of the multiple blades of magnetic resonance data comprise coil specific magnetic resonance data acquired for each of the multiple antenna elements simultaneously;
wherein execution of the machine executable instructions causes the processor to acquire the multiple blades of magnetic resonance data using the pulse sequence data to control the magnetic resonance imaging system; and
wherein execution of the machine executable instructions further causes the processor to perform the following for each of the multiple blades of magnetic resonance data:
reconstruct a blade image from the coil specific magnetic resonance data for each of the multiple antenna elements according to a parallel imaging magnetic resonance imaging protocol,
construct a Chi map for the blade image using the set of coil sensitivities, the blade image, and the coil specific magnetic resonance data, wherein the Chi map comprises a voxel for each voxel in the blade image, wherein each voxel of the Chi map is descriptive of the probability that the voxel of the blade image contains an artifact and, wherein execution of the instructions further cause the processor to reconstruct a measured coil image for each of the multiple antenna elements from the coil specific magnetic resonance data , wherein execution of the machine executable instruction further cause the processor to construct a reference coil image for each of the multiple antenna elements by back folding the blade image using the set of coil sensitivities, and wherein the Chi map is constructed for the blade image by taking a norm of the difference between the measured coil image and the reference coil image for each of the multiple antenna elements, and
calculate a k-space blade data by transforming each blade image to k-space for each of the multiple blades of magnetic resonance data, wherein execution of the instructions further cause the processor to reconstruct a low-resolution blade image for of the multiple blades of magnetic resonance data by Fourier transforming a central k-space region from each k-space blade data, wherein the low-resolution blade map has a specified resolution, wherein execution of the instructions further cause the processor to calculate a low resolution Chi map for each blade image by mapping the Chi map for each blade image to the specified resolution.

2. The magnetic resonance imaging system of claim 1, wherein the Chi map has the value: Chi=$\Sigma_i$ Norm($m_i$−$S_i p_i$), wherein i represents a coil element chosen from the multiple coil elements, $S_i$ is the coil sensitivity encoding matrix for coil element i, $m_i$ is the measured coil image for coil element i, and $p_i$ is the blade image.

3. The magnetic resonance imaging system of claim 1, wherein execution of the instructions further causes the processor to calculate corrected k-space data by performing a modified PROPELLER motion correction using the k-space blade data and the low-resolution chi map for each of the multiple blades.

4. The magnetic resonance imaging system of claim 3, wherein execution of the instructions further causes the processor to reconstruct a magnetic resonance image using the corrected k-space data.

5. The magnetic resonance imaging system of claim 3, wherein execution of the instructions further causes the processor to perform the modified PROPELLER motion correction by iteratively comparing the low-resolution blade image for each of the multiple blades of magnetic resonance data with all other of the low-resolution blade images for each of the multiple blades of magnetic resonance data, wherein the modified PROPELLER motion correction incorporates an analysis of the low resolution Chi map for each of the multiple blades of magnetic resonance data.

6. The magnetic resonance imaging system of claim 5, wherein the modified PROPELLER motion correction incorporates the low resolution Chi map by ignoring a pixel in the low resolution blade image if a corresponding pixel in the low-resolution Chi map is a above a predetermined threshold.

7. The magnetic resonance imaging system of claim 5, wherein the modified PROPELLER motion correction incorporates the low resolution Chi map by weighting pixels of the low-resolution blade images during the iterative comparison using the values of corresponding pixels in the low-resolution Chi map.

8. The magnetic resonance imaging system of claim 5, wherein execution of the instructions further cause the processor to replace the set of coil sensitivities using the corrected coil sensitivity map for each of the multiple antenna elements, wherein execution of the instructions cause the processor to repeat the following steps for each of the multiple blades of magnetic resonance data after replacing the coil sensitivity map:
 reconstruct the measured coil image for each of the multiple antenna elements from the coil specific magnetic resonance data,
 construct the reference coil image for each of the multiple antenna elements by backfolding the blade image using the set of coil sensitivities,
 construct the Chi map for the blade image using the set of coil sensitivities, the blade image, and the coil specific magnetic resonance data, and
 calculate the k-space blade data by transforming each blade image to k-space; and wherein execution of the instructions further causes the processor to:
 calculate final k-space data by performing a PROPELLER motion correction using the k-space blade data after replacing the coil sensitivity map, and
 calculate a final magnetic resonance image using the final k-space data.

9. The magnetic resonance imaging system of claim 1, wherein execution of the instructions causes the processor to calculate an artifact-free low resolution image by averaging the low-resolution image for each blade, wherein execution of the instructions causes the processor to weight the contribution from each pixel of each low resolution blade image using the low resolution Chi map.

10. The magnetic resonance imaging system of claim 9, wherein execution of the instructions causes the processor to calculate a corrected coil sensitivity map for each of the multiple antenna elements using the artifact-free low resolution image.

11. The magnetic resonance imaging system of claim 1, wherein the parallel imaging magnetic resonance imaging protocol is any one of the following: a SENSE protocol, a GRAPPA protocol, and a hybrid SENSE-GRAPPA protocol.

12. A method of operating a magnetic resonance imaging system, wherein the magnetic resonance imaging system is configured for acquiring magnetic resonance data from an imaging zone, wherein the magnetic resonance imaging system comprises a radio-frequency system for acquiring the magnetic resonance data, wherein the radio-frequency system comprises a magnetic resonance antenna with multiple antenna elements; wherein pulse sequence data is configured to cause the processor to acquire the magnetic resonance data as multiple blades of magnetic resonance data according to a PROPELLER magnetic resonance imaging protocol; wherein the pulse sequence data is further configured such that the multiple blades of magnetic resonance data comprises coil specific magnetic resonance data acquired for each of the multiple antenna elements simultaneously;
 wherein the method comprises the step of acquiring the multiple blades of magnetic resonance data using the pulse sequence data to control the magnetic resonance imaging system; and
 wherein the method further comprises perform the following steps for each of the multiple blades of magnetic resonance data:
 reconstructing a blade image from the coil specific magnetic resonance data for each of the multiple antenna elements according to a parallel imaging magnetic resonance imaging protocol,
 constructing a Chi map for the blade image using the set of coil sensitivities, the blade image, and the coil specific magnetic resonance data, wherein the Chi map comprises a voxel for each voxel in the blade image, wherein each voxel of the Chi map is descriptive of the probability that the voxel of the blade image contains an artifact and
 to reconstruct a measured coil image for each of the multiple antenna elements from the coil specific magnetic resonance data, wherein execution of the machine executable instruction further cause the processor to construct a reference coil image for each of the multiple antenna elements by backfolding the blade image using the set of coil sensitivities, and wherein the Chi map is constructed for the blade image by taking a norm of the difference between the measured coil image and the reference coil image for each of the multiple antenna elements, and
 calculate a k-space blade data by transforming each blade image to k-space for each of the multiple blades of magnetic resonance data, wherein execution of the instructions further cause the processor to reconstruct a low-resolution blade image for of the multiple blades of magnetic resonance data by Fourier transforming a central k-space region from each k-space blade data, wherein the low-resolution blade map has a specified resolution, wherein execution of the instructions further cause the processor to calculate a low resolution Chi map for each blade image by mapping the Chi map for each blade image to the specified resolution.

13. The method of claim 12, wherein the Chi map has the value: $Chi=\Sigma_i\ Norm(m_i-S_i p_i)$, wherein i represents a coil element chosen from the multiple coil elements, Si is the coil sensitivity encoding matrix for coil element i, $m_i$ is the measured coil image for coil element i, and $p_i$ is the blade image.

14. The method of claim 12, wherein execution of the machine executable instructions further causes the processor to calculate corrected k-space data by performing a modified PROPELLER motion correction using the k-space blade data and the low-resolution chi map for each of the multiple blades.

15. The method of claim 14, wherein execution of the machine executable instructions further causes the processor to reconstruct a magnetic resonance image using the corrected k-space data.

16. A computer program product comprising machine executable instructions for execution by a processor for controlling a magnetic resonance imaging system, wherein the magnetic resonance imaging system is configured for acquiring magnetic resonance data from an imaging zone, wherein the magnetic resonance imaging system comprises:
 a radio-frequency system for acquiring the magnetic resonance data, wherein the radio-frequency system comprises a magnetic resonance antenna with multiple antenna elements;
 a processor for controlling the magnetic resonance imaging system; and
 a memory containing pulse sequence data and a set of coil sensitivities for the multiple antenna elements; wherein the pulse sequence data is configured to cause the processor to acquire the magnetic resonance data as multiple blades of magnetic resonance data according to a PROPELLER magnetic resonance imaging protocol; wherein the pulse sequence data is further configured such that the multiple blades of magnetic resonance data comprises coil specific magnetic resonance data acquired for each of the multiple antenna elements simultaneously;
 wherein execution of the machine executable instructions causes the processor to acquire the multiple blades of magnetic resonance data using the pulse sequence data to control the magnetic resonance imaging system; and
 wherein execution of the machine executable instructions further causes the processor to perform the following for each of the multiple blades of magnetic resonance data:
  reconstruct a blade image from the coil specific magnetic resonance data for each of the multiple antenna elements according to a parallel imaging magnetic resonance imaging protocol,
  construct a Chi map for the blade image using the set of coil sensitivities, the blade image, and the coil specific magnetic resonance data, wherein the Chi map comprises a voxel for each voxel in the blade image, wherein each voxel of the Chi map is descriptive of the probability that the voxel of the blade image contains an artifact and reconstruct a measured coil image for each of the multiple antenna elements from the coil specific magnetic resonance data, wherein execution of the machine executable instruction further cause the processor to construct a reference coil image for each of the multiple antenna elements by backfolding the blade image using the set of coil sensitivities, and wherein the Chi map is constructed for the blade image by taking a norm of the difference between the measured coil image and the reference coil image for each of the multiple antenna elements, and
  calculate a k-space blade data by transforming each blade image to k-space for each of the multiple blades of magnetic resonance data, wherein execution of the instructions further cause the processor to reconstruct a low-resolution blade image for of the multiple blades of magnetic resonance data by Fourier transforming a central k-space region from each k-space blade data, wherein the low-resolution blade map has a specified resolution, wherein execution of the instructions further cause the processor to calculate a low resolution Chi map for each blade image by mapping the Chi map for each blade image to the specified resolution.

17. The computer program of claim 16, wherein the Chi map has the value: $Chi=\Sigma_i\ Norm(m_i-S_i p_i)$, wherein i represents a coil element chosen from the multiple coil elements, Si is the coil sensitivity encoding matrix for coil element i, $m_i$ is the measured coil image for coil element i, and $p_i$ is the blade image.

18. The computer program of claim 16, wherein execution of the machine executable instructions further causes the processor to calculate corrected k-space data by performing a modified PROPELLER motion correction using the k-space blade data and the low-resolution chi map for each of the multiple blades.

19. The computer program of claim 18, wherein execution of the machine executable instructions further causes the processor to reconstruct a magnetic resonance image using the corrected k-space data.

* * * * *